(12) United States Patent
Kunimoto

(10) Patent No.: US 9,824,963 B2
(45) Date of Patent: Nov. 21, 2017

(54) WIRING BOARD, AND SEMICONDUCTOR DEVICE

(71) Applicant: SHINKO ELECTRIC INDUSTRIES CO., LTD., Nagano-shi, Nagano (JP)

(72) Inventor: Yuji Kunimoto, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/376,854

(22) Filed: Dec. 13, 2016

(65) Prior Publication Data
US 2017/0179013 A1 Jun. 22, 2017

(30) Foreign Application Priority Data

Dec. 16, 2015 (JP) .................. 2015-245207

(51) Int. Cl.
*H01L 23/498* (2006.01)
*H01L 23/48* (2006.01)
*H01L 21/48* (2006.01)

(52) U.S. Cl.
CPC ...... *H01L 23/49822* (2013.01); *H01L 21/486* (2013.01); *H01L 21/4857* (2013.01); *H01L 23/49827* (2013.01); *H01L 23/49838* (2013.01); *H01L 23/49866* (2013.01); *H01L 2224/16225* (2013.01); *H01L 2224/73204* (2013.01); *H01L 2224/97* (2013.01)

(58) Field of Classification Search
CPC ...... H05K 2201/09309; H01L 23/5383; H01L 23/49861; H01L 21/486; H01L 21/4857; H01L 23/49822; H01L 23/49827; H01L 23/49838; H01L 23/49866; H01L 2224/97; H01L 2224/16225; H01L 2224/73204; H01L 2224/73253; H01L 23/5384

See application file for complete search history.

(56) References Cited

U.S. PATENT DOCUMENTS

2003/0168249 A1* 9/2003 Ito .................. H05K 3/0052
174/255

FOREIGN PATENT DOCUMENTS

JP 2014-225632 12/2014

\* cited by examiner

*Primary Examiner* — Jasmine Clark
(74) *Attorney, Agent, or Firm* — Rankin, Hill & Clark LLP

(57) ABSTRACT

A wiring board includes: a core substrate including: a metal plate having first through holes; a first insulating layer covering an upper surface and a lower surface of the metal plate and inner wall surfaces of the first through holes; through electrodes penetrating the first insulating layer in a thickness direction and each having an upper end surface; a first wiring layer formed on a lower surface of the first insulating layer and connected to the through electrodes; a wiring structure formed on an upper surface of the first insulating layer; and an outermost insulating layer formed on a lower surface of the core substrate. A wiring density of the wiring structure is higher than that of the core substrate. The metal plate is located at a side of the wiring structure with respect to a center of the first insulating layer in a thickness direction thereof.

5 Claims, 7 Drawing Sheets

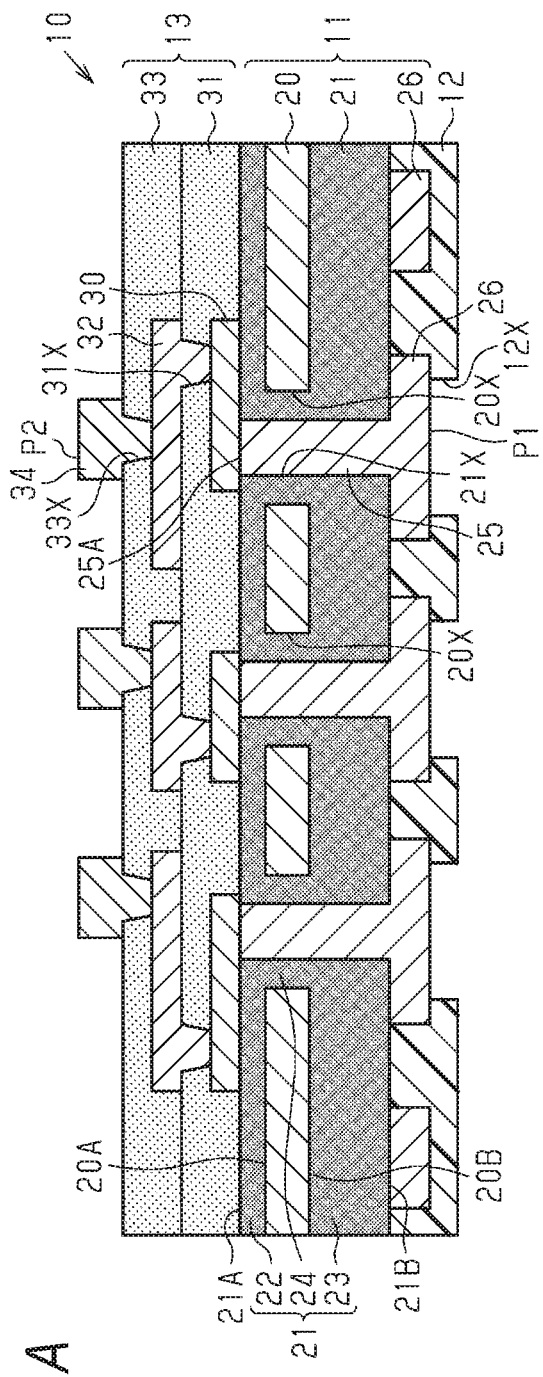
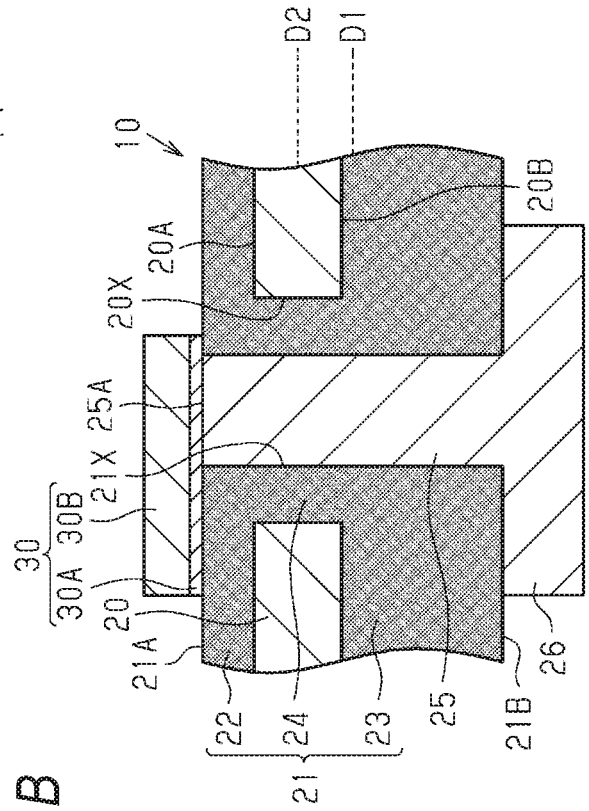
FIG. 1A
FIG. 1B

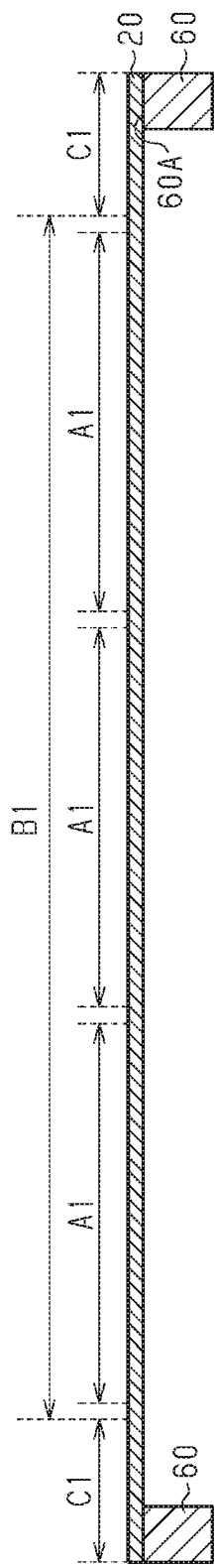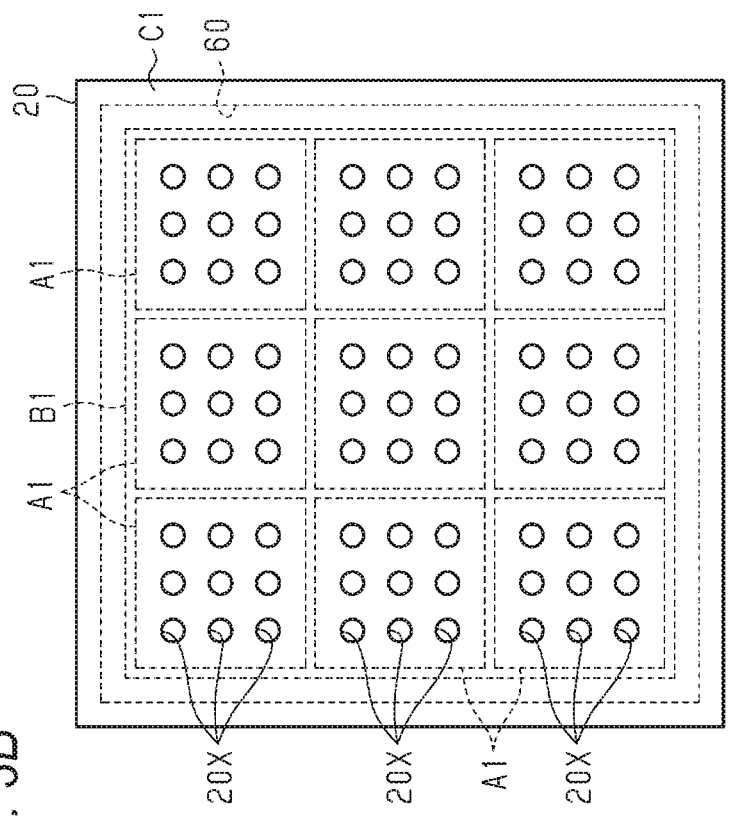

WIRING BOARD, AND SEMICONDUCTOR DEVICE

This application claims priority from Japanese Patent Application No. 2015-245207, filed on Dec. 16, 2015, the entire contents of which are herein incorporated by reference.

BACKGROUND

1. Technical Field

The present disclosure relates to a wiring board, and a semiconductor device.

2. Description of the Related Art

In the related art, as a wiring board on which an electronic component such as a semiconductor chip can be mounted, there has been known a wiring board in which a plurality of wiring layers and a plurality of insulating layers are provided on one another alternately by a build-up method on opposite upper and lower surfaces of a core substrate in order to increase the density of wiring patterns. As this kind of wiring board, there has been proposed a wiring board in which a low-density wiring layer including an insulating layer made of a thermosetting resin is formed on a core substrate, and a high-density wiring layer including an insulating layer made of a photosensitive resin is formed on the low-density wiring layer (e.g. see JP-A-2014-225632).

In recent years, an increase in the density of electronic components which can be mounted on the wiring board and reduction in the size of each electronic component have been advanced more greatly, and a request for reducing the size and the thickness of the wiring board has been further increased. When the thickness of the core substrate of the wiring board is reduced in order to satisfy such a request, mechanical strength of the core substrate is however lowered. Therefore, there arises a problem that rigidity of the wiring board is lowered and warping is apt to occur in the wiring board.

SUMMARY

According to one or more aspects of the present disclosure, there is provided a wiring board. The wiring board comprises:
  a core substrate comprising:
    a metal plate having a plurality of first through holes;
    a first insulating layer covering an upper surface and a lower surface of the metal plate and inner wall surfaces of the first through holes;
    a plurality of through electrodes each disposed in a corresponding one of the first through holes to penetrate the first insulating layer in a thickness direction of the first insulating layer and each having an upper end surface exposed from the first insulating layer;
    a first wiring layer formed on a lower surface of the first insulating layer and connected to the through electrodes:
  a wiring structure formed on an upper surface of the first insulating layer and comprising insulating layers each made of an insulating resin containing a photosensitive resin as a main component, and wiring layers; and
  an outermost insulating layer formed on a lower surface of the core substrate.

A wiring density of the wiring structure is higher than that of the core substrate. The metal plate is located at a side of the wiring structure with respect to a center of the first insulating layer in a thickness direction thereof.

BRIEF DESCRIPTION OF THE DRAWINGS

FIG. 1A is a schematic sectional view showing a wiring board according to an embodiment;

FIG. 1B is an enlarged sectional view showing an enlarged part of the wiring board in FIG. 1A;

FIG. 3A is a schematic sectional view showing a method for manufacturing the wiring board according to the embodiment;

FIG. 3B is a schematic plan view showing the method for manufacturing the wiring board according to the embodiment:

DETAILED DESCRIPTION

Figure 2:
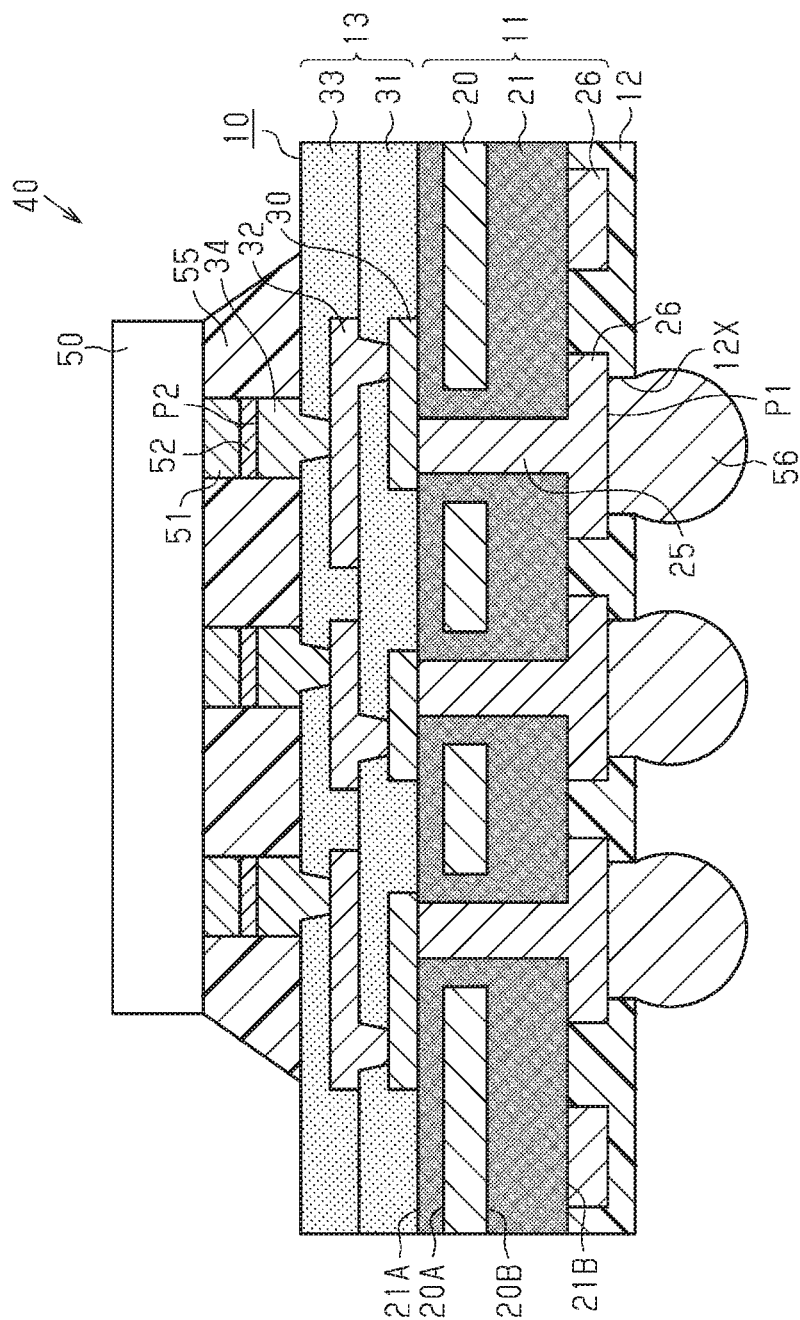
FIG. 2 is a schematic sectional view showing a semiconductor device according to the embodiment.

An embodiment will be described below with reference to the accompanying drawings.

Incidentally, for convenience's sake, a portion regarded as a characteristic may be enlarged and shown in the accompanying drawings in order to make the characteristic easy to understand but dimension ratios of respective constituent elements are not always exactly the same as practical ones. In addition, in sectional views, in order to make sectional structures of respective members easy to understand, hatchings of some of the members are replaced by matt patterns and shown, and others of the members are not hatched. Incidentally, in description of the invention, "plan view" means a view of a subject seen from a vertical direction (illustrated up/down direction) of FIGS. 1A and 1B etc., and "planar shape" means a shape of the subject seen from the vertical direction of FIGS. 1A and 1B etc.

First, the structure of a wiring board 10 will be described in accordance with FIGS. 1A and 1B.

As shown in FIG. 1A, the wiring board 10 has a core substrate 11, a solder resist layer 12, and a wiring structure 13. The solder resist layer 12 is provided on a lower surface of the core substrate 11. The wiring structure 13 is provided on an upper surface of the core substrate 11.

The core substrate 11 has a metal plate 20, an insulating layer 21, through electrodes 25, and a wiring layer 26. The metal plate 20 serves as a core material. The insulating layer 21 covers the metal plate 20. The through electrodes 25 penetrate the insulating layer 21 in a thickness direction. The wiring layer 26 is formed on a lower surface of the insulating layer 21.

For example, the metal plate 20 is a flat plate substantially shaped like a rectangle in plan view. The thickness of the metal plate 20 can be set, for example, in a range of about 20 to 100 µm. For example, a metal material which is low in coefficient of thermal expansion (CTE) can be used as the material of the metal plate 20. For example, a metal material having a lower coefficient of thermal expansion than the coefficient of thermal expansion (e.g. 10 to 30 ppm/° C.) of the insulating layer 21 may be used as the material of the metal plate 20. In addition, a metal material high in elastic modulus can be used as the material of the metal plate 20. For example, a metal material having a higher elastic modulus than the elastic modulus (e.g. Young's modulus which is 15 to 30 GPa) of the insulating layer 21 may be used as the material of the metal plate 20. For example, a metal material having a coefficient of thermal expansion in a range of about 3 to 25 ppm/° C. and a Young's modulus in a range of about 60 to 350 GPa can be used as the material of the metal plate 20. For example, tungsten (W), titanium (Ti), stainless steel (SUS), nickel (Ni), copper (Cu) or aluminum (Al) can be used as the material of such a metal plate 20. In the embodiment, tungsten is used as the material of the metal plate 20 in view of easiness in thinning, easiness in machining etc.

Through holes 20X are formed at predetermined places (three in FIG. 1A) in the metal plate 20. Each of the through holes 20X is formed to penetrate the metal plate 20 from its upper surface 20A to its lower surface 20B. The through hole 20X can be formed into any planar shape and with any size. For example, the planar shape of the through hole 20X may be formed as a circular shape having a diameter in a range of about 20 to 150 μm. Incidentally, an opening width of the through hole 20X can be set to have a small length substantially equal to the thickness of the metal plate 20.

The insulating layer 21 is formed to make contact with the upper surface 20A of the metal plate 20, the lower surface 20B of the metal plate 20 and inner wall surfaces of the through holes 20X so as to cover the entire upper surface 20A, the entire lower surface 20B and the entire inner wall surfaces of the through holes 20X. In addition, the insulating layer 21 is formed to expose outer side surfaces of the metal plate 20. For example, outer side surfaces of the insulating layer 21 are formed to be substantially flush with the outer side surfaces of the metal plate 20 respectively. For example, a non-photosensitive insulating resin containing a thermosetting resin such as an epoxy-based resin or a polyimide-based resin as a main component can be used as the material of the insulating layer 21. For example, the insulating layer 21 may contain a filler such as silica or alumina.

As shown in FIG. 1B, for example, the insulating layer 21 is constituted by an insulating layer 22, an insulating layer 23 and an insulating layer 24 which are formed integrally. The insulating layer 22 is formed on the upper surface 20A of the metal plate 20. The insulating layer 23 is formed on the lower surface 20B of the metal plate 20. The insulating layer 24 is formed along the inner wall surfaces of the through holes 20X. Here, the insulating layer 22 is formed to be thinner in thickness than the insulating layer 23. For example, the thickness of the insulating layer 22 can be set to be about ½ to ⅓ of the thickness of the insulating layer 23. The thickness of the insulating layer 22 can be set, for example, in a range of about 10 to 15 μm. The thickness of the insulating layer 23 can be set, for example, in a range of about 20 to 30 μm.

To see the metal plate 20 in another way, the metal plate 20 is provided on an upper side (wiring structure 13 side) from a thicknesswise central position D1 of the insulating layer 21. Specifically, a thicknesswise central position D2 of the metal plate 20 is disposed at a position on the upper side from the central position D1. Further, the metal plate 20 is provided on the upper side from the central position D1 so as to be located in the vicinity of the thicknesswise center of the wiring board 10 as a whole. Specifically, the metal plate 20 is provided on the upper side from the central position D1 so as to be located in the thicknesswise center of the wiring board 10 as a whole excluding the solder resist layer 12. That is, in the wiring board 10, the thickness of the insulating layer 22 and the thickness of the insulating layer 23 are set so that the metal plate 20 can be located in the thicknesswise center of the wiring board 10 except the solder resist layer 12.

In addition, through holes 21X are formed in the insulating layer 21 and at positions overlapping with the through holes 20X in plan view. Each of the through holes 21X has a smaller planar shape than a corresponding through hole 20X. The through hole 21X is formed to penetrate the insulating layer 21 from its upper surface 21A to its lower surface 21B. That is, the through hole 21X is formed to penetrate the insulating layer 22, the insulating layer 23, and the insulating layer 24 in the thickness direction. For example, the planar shape of the through hole 21X is formed to be similar to that of the through hole 20X but a size smaller than that of the through hole 20X. For example, the planar shape of the through hole 21X can be formed as a circular shape having a diameter in a range of about 15 to 130 μm.

The through electrodes 25 which penetrate the insulating layer 21 in the thickness direction are formed in the through holes 21X. The through electrodes 25 in this example are formed to fill the through holes 21X. The through electrodes 25 are electrically insulated from the metal plate 20 by the insulating layer 21 (insulating layer 24). Incidentally, for example, copper or a copper alloy can be used as the material of the through electrodes 25.

An upper end surface 25A of each of the through electrodes 25 is exposed from the upper surface 21A of the insulating layer 21. For example, the upper end surface 25A of the through electrode 25 is formed to be substantially flush with the upper surface 21A of the insulating layer 21. The upper surface 21A of the insulating layer 21 and the upper end surface 25A of the through electrode 25 are smooth surfaces (low roughness surface) with small unevenness. For example, the upper surface 21A of the insulating layer 21 and the upper end surface 25A of the through electrode 25 are polished surfaces. For example, the upper surface 21A of the insulating layer 21 and the upper end surface 25A of the through electrode 25 are smaller in surface roughness than the lower surface 21B of the insulating layer 21. Roughness of each of the upper surface 21A of the insulating layer 21 and the upper end surface 25A of the through electrode 25 is set, for example, to be about 15 to 40 nm in terms of surface roughness Ra value. In addition, roughness of the lower surface 21B of the insulating layer 21 is set, for example, to be about 300 to 400 nm in terms of surface roughness Ra value. Here, the surface roughness Ra value is called arithmetic average roughness, which is a kind of numerical value expressing surface roughness. Specifically, the surface roughness Ra value is calculated as follows. That is, heights varying within a measurement region are measured from a surface corresponding to an average line, and absolute values of the measured heights are arithmetically averaged.

The wiring layer 26 is formed on the lower surface 21B of the insulating layer 21. The wiring layer 26 is connected to lower surfaces of the through electrodes 25 so as to be electrically connected to the through electrodes 25. For example, the wiring layer 26 is formed integrally with the through electrodes 25. The wiring layer 26 is electrically insulating from the metal plate 20 by the insulating layer 21

(insulating layer 23). The thickness of the wiring layer 26 can be set, for example, in a range of about 15 to 35 µm. The line-and-space (L/S) of the wiring layer 26 can be set, for example, at about 20 µm/20 µm. Here, the line-and-space (L/S) means the width of each wiring, and an interval between adjacent wirings. Incidentally, copper or a copper alloy can be used as the material of the wiring layer 26.

As shown in FIG. 1A, the solder resist layer 12 is provided on the lower surface of the aforementioned core substrate 11 (specifically, the lower surface 21B of the insulating layer 21) so as to cover a portion of the wiring layer 26. The solder resist layer 12 is an outermost (lowermost in this case) insulating layer in the wiring board 10. As the material of the solder resist layer 12, for example, a photosensitive insulating resin containing a phenol-based resin, a polyimide-based resin etc. as a main component can be used. For example, the solder resist layer 12 may contain a filler such as silica or alumina. The thickness of the solder resist layer 12 can be set, for example, in a range of about 30 to 50 µm.

Opening portions 12X for exposing parts of the lowermost wiring layer 26 as external connection pads P1 are formed in the solder resist layer 12. External connection terminals 56 (see FIG. 2) which can be used when the wiring board 10 is mounted on a mount board such as a motherboard can be connected to the external connection pads P1.

Incidentally, if occasions demand, a surface treatment layer may be formed on the wiring layer 26 exposed from the opening portions 12X. A gold (Au) layer, a nickel (Ni) layer/Au layer (a metal layer in which an Ni layer and an Au layer have been formed in the named order), an Ni layer/palladium (Pd) layer/Au layer (a metal layer in which an Ni layer, a Pd layer and an Au layer have been formed in the named order), etc. can be enumerated as examples of the surface treatment layer. Here, the Au layer is a metal layer made of Au or an Au alloy. The Ni layer is a metal layer made of Ni or an Ni alloy. The Pd layer is a metal layer made of Pd or a Pd alloy. For example, a metal layer (electroless plating metal layer) formed by electroless plating can be used as each of the Ni layer, the Au layer and the Pd layer. In addition, antioxidant treatment such as OSP (Organic Solderability Preservative) treatment may be applied to front surfaces of the external connection pads P1 to form a surface treatment layer thereon. For example, when the OSP treatment is applied, a surface treatment layer constituted by an organic coating of an azole compound, an imidazole compound, etc. is formed on the front surfaces of the external connection pads P1. Incidentally, the wiring layer 26 per se exposed from the opening portions 12X (or the surface treatment layer when the surface treatment layer is formed on the wiring layer 26) may be used as external connection terminals.

Each opening portion 12X and each external connection pad P1 can be formed into any planar shapes and with any sizes. For example, the planar shape of the opening portion 12X and the planar shape of the external connection pad P1 can be formed as circular shapes each having a diameter in a range of about 100 to 150 µm. A pitch between adjacent ones of the external connection pads P1 can be set, for example, in a range of about 200 to 300 µm.

Next, the structure of the wiring structure 13 will be described.

The wiring structure 13 is a wiring structure which is provided on the upper surface 21A of the insulating layer 21. The wiring structure 13 is a high-density wiring structure in which wiring layers higher in wiring density than the wiring layer 26 of the core substrate 11 are formed.

The wiring structure 13 has a structure in which a wiring layer 30 formed on the upper surface 21A of the insulating layer 21, an insulating layer 31, a wiring layer 32, an insulating layer 33, and a wiring layer 34 are formed in the named order.

Here, for example, an insulating resin which contains a photosensitive resin such as a phenol-based resin or a polyimide-based resin as a main component can be used as the material of each of the insulating layers 31 and 33. For example, the insulating layer 31, 33 may contain a filler such as silica or alumina. For example, copper or a copper alloy can be used as the material of each of the wiring layers 30, 32 and 34.

The wiring layer 30, 32, 34 is a wiring layer thinner than the wiring layer 26 of the core substrate 11. The thickness of the wiring layer 30, 32 formed on the insulating layer 21, 31 can be set, for example, in a range of about 1 to 5 Gm. The thickness of the wiring layer 34 formed on the insulating layer 33 can be set, for example, in a range of about 5 to 10 µm. The width of each wiring and an interval between adjacent wirings in the wiring layer 30, 32, 34 are smaller than the width of each wiring and an interval between adjacent wirings in the wiring layer 26 inside the core substrate 11. The line-and-space (L/S) of the wiring layer 30, 32, 34 can be set, for example, at about 2 µm/2 µm. In addition, the insulating layer 31, 33 is an insulating layer thinner than the insulating layer 21 inside the core substrate 11. The thickness of the insulating layer 31, 33 can be set, for example, in a range of about 3 to 10 µm.

The wiring layer 30 is formed on the upper surface 21A of the insulating layer 21 so as to be connected to the upper end surfaces 25A of the through electrodes 25. That is, parts of a lower surface of the wiring layer 30 make contact with the upper end surfaces 25A of the through electrodes 25, and the wiring layer 30 and the through electrodes 25 are electrically connected to each other. In other words, although the wiring layer 30 and the through electrodes 25 are electrically connected to each other, they are formed not integrally but separately. The wiring layer 30 is electrically insulated from the metal plate 20 by the insulating layer 21 (insulating layer 22).

As shown in FIG. 1B, for example, the wiring layer 30 has a seed layer 30A (e.g. a laminate of a Ti layer and a Cu layer) which is formed on the upper end surfaces 25A of the through electrodes 25 (e.g. a Cu layer), and a metal layer 30B (e.g. a Cu layer) which is formed on the seed layer 30A. That is, the metal layer 30B is connected to the through electrodes 25 through the seed layer 30A.

The seed layer 30A is formed to cover the upper end surfaces 25A of the through electrodes 25 and cover the upper surface 21A of the insulating layer 21 in the vicinities of the upper end surfaces 25A. As the seed layer 30A, a metal film (sputtered film) formed by sputtering can be used. For example, a metal film having a two-layer structure in which a titanium (Ti) layer made of Ti and a copper (Cu) layer made of Cu are formed in the named order on the upper end surfaces 25A of the through electrodes 25 and the upper surface 21A of the insulating layer 21 can be used as the seed layer 30A formed by sputtering. In this case, the thickness of the Ti layer can be set, for example, in a range of about 10 to 50 nm, and the thickness of the Cu layer can be set, for example, in a range of about 100 to 500 nm. Incidentally, the Ti layer serves as a metallic barrier layer for suppressing copper from being diffused from the Cu layer or the metal layer 30B (e.g. the Cu layer) into the insulating layer 21. In addition, the Ti layer serves as an adhesive layer for improving adhesion between the insulating layer 21 and the seed layer 30A. In addition to Ti, titanium nitride (TiN), tantalum nitride (TaN), tantalum (Ta), chromium (Cr) etc. can be used as the material of such a metal film which can serve as both the metallic barrier layer and the adhesive layer.

The metal layer 30B is formed to cover an upper surface of the seed layer 30A. As the metal layer 30B, for example, a metal layer (electrolytic plating metal layer) formed by electrolytic plating can be used. Incidentally, for example, copper or a copper alloy can be used as the material of the metal layer 30B. The thickness of the metal layer 30B can be set, for example, in a range of about 2 to 5 μm.

As shown in FIG. 1A, the insulating layer 31 is formed on the upper surface 21A of the insulating layer 21 so as to cover a portion of the wiring layer 30. Through holes 31X which penetrate the insulating layer 31 in the thickness direction to expose parts of the upper surface of the wiring layer 30 are formed at required places in the insulating layer 31.

The wiring layer 32 is formed on an upper surface of the insulating layer 31. The wiring layer 32 is electrically connected to the wiring layer 30. The wiring layer 32 has via wirings filled in the through holes 31X, and wiring patterns formed on the upper surface of the insulating layer 31.

The insulating layer 33 is formed on the upper surface of the insulating layer 31 so as to cover a portion of the wiring layer 32. Through holes 33X which penetrate the insulating layer 33 in the thickness direction to expose parts of an upper surface of the wiring layer 32 are formed at required places in the insulating layer 33.

Each of the through holes 31X and 33X is formed into a tapered shape whose diameter is gradually smaller from the upper side (wiring layer 34 side) toward the lower side (core substrate 11 side) in FIG. 1A. For example, the through hole 31X, 33X is formed into an inverted truncated conical shape in which an opening diameter of an upper-side opening end is larger than an opening diameter of a lower-side opening end. The opening diameter of the upper-side opening end of the through hole 31X, 33X can be set, for example, in a range of about 10 to 20 μm.

The wiring layer 34 is formed on an upper surface of the insulating layer 33. The wiring layer 34 is electrically connected to the wiring layer 32. The wiring layer 34 has via wirings filled in the through holes 33X, and pads P2 protruding upward from the upper surface of the insulating layer 33. Each of the pads P2 can be formed into any planar shape and with any size. For example, the planar shape of the pad P2 can be formed as a circular shape having a diameter in a range of about 20 to 30 μm. A pitch between adjacent ones of the pads P2 can be set, for example, in a range of about 40 to 60 μm. The pads P2 serve as electronic component mounting pads for making electric connection with an electronic component such as a semiconductor chip 50 (see FIG. 2).

Incidentally, if occasions demand, a surface treatment layer may be formed on front surfaces (upper surfaces and side surfaces or only upper surfaces) of the pads P2. As the surface treatment layer, for example, a surface treatment layer the same as that formed on the external connection pads P1 can be used.

As described above, in the wiring board 10, the metal plate 20 is disposed in the vicinity of the thicknesswise center of the wiring board 10 as a whole. The thicknesses of the respective members will be described below by way of example. For example, on the upper surface 20A side of the metal plate 20, the thickness of the insulating layer 22 is set at about 10 μm, the thickness of the wiring layer 30 is set at about 2 μm, the thickness between the upper surface of the wiring layer 30 and the upper surface of the insulating layer 31 is set at about 5 μm, the thickness of the wiring layer 32 is set at about 2 μm, the thickness between the upper surface of the wiring layer 32 and the upper surface of the insulating layer 33 is set at about 5 μm, and the thickness of the wiring layer 34 is set at about 10 μm. In addition, on the lower surface 20B of the metal plate 20, the thickness of the insulating layer 23 is set at about 20 μm and the thickness of the wiring layer 26 is set at about 15 μm Thus, in the wiring board 10 in this example, the thickness of a structure body formed on the upper surface 20A of the metal plate 20 is set at about 34 μm, the thickness of a structure body (structure body excluding the solder resist layer 12) formed on the lower surface 20B of the metal plate 20 is set at about 35 μm Therefore, the metal plate 20 is disposed substantially in the thicknesswise center of the wiring board 10 as a whole excluding the solder resist layer 12. Further, when the thickness of the metal plate 20 is about 50 μm and the thickness between the lower surface of the wiring layer 26 and the lower surface of the solder resist layer 12 is about 25 μm in this example, the thickness of the wiring board 10 as a whole can be set to be as thin as 150 μm or less.

Next, the structure of a semiconductor device 40 will be described in accordance with FIG. 2.

The semiconductor device 40 has the wiring board 10, one or a plurality of semiconductor chips 50, an underfill resin 55, and external connection terminals 56.

Each semiconductor chip 50 is flip-chip mounted on the wiring board 10. That is, when connection terminals 51 disposed on a circuit formation surface (lower surface in this case) of the semiconductor chip 50 are bonded to the pads P2 of the wiring board 10 through a bonding member 52, the semiconductor chip 50 is electrically connected to the pads P2 (wiring layer 34) through the connection terminals 51 and the bonding member 52.

For example, a logic chip such as a CPU (Central Processing Unit) chip or a GPU (Graphics Processing Unit) chip can be used as the semiconductor chip 50. For example, a memory chip such as a DRAM (Dynamic Random Access Memory) chip, an SRAM (Static Random Access Memory) chip or a flash memory chip may be alternatively used as the semiconductor chip 50. Incidentally, when a plurality of semiconductor chips 50 are mounted on the wiring board 10, the logic chip and the memory chip may be used in combination to be mounted on the wiring board 10.

For example, a metal post can be used as each of the connection terminals 51. The connection terminal 51 is a columnar connection terminal extending downward from the circuit formation surface of the semiconductor chip 50. For example, the connection terminal 51 in this example is formed into a cylindrical shape. For example, copper or a copper alloy can be used as the material of the connection terminal 51. In addition to the metal post, for example, a gold bump may be used as the connection terminal 51.

The bonding member 52 is bonded to the pads P2, and bonded to the connection terminals 51. For example, a tin (Sn) layer or solder plating can be used as the bonding member 52. For example, an Sn-silver (Ag)-based, Sn—Cu-based, or Sn—Ag—Cu-based lead (Pb)-free solder can be used as the material of the solder plating.

The underfill resin 55 is provided to fill a gap between the wiring board 10 and the semiconductor chip 50. For example, an insulating resin such as an epoxy-based resin can be used as the material of the underfill resin 55.

The external connection terminals 56 are formed on the external connection pads P1 of the wiring board 10. For example, the external connection terminals 56 are connection terminals which can be electrically connected to pads provided in a mount board (not shown) such as a motherboard. For example, solder balls or lead pins can be used as the external connection terminals 56. Incidentally, the solder balls are used as the external connection terminals 56 in this example.

Next, functions of the wiring board 10 and the semiconductor device 40 will be described with reference to FIGS. 1A and 1B and FIG. 2.

The metal plate 20 high in mechanical strength (rigidity) is provided as the core material of the core substrate 11. Rigidity of the core substrate 11 can be enhanced by the metal plate 20. Even in the case where, for example, the core substrate 11 has been made thin, the rigidity of the core substrate 11 can be secured by the metal plate 20. Hence, rigidity of the wiring board 10 can be secured. Therefore, warping can be preferably suppressed from occurring in the wiring board 10 while the wiring board 10 as a whole is made thin.

In addition, the wiring board 10 has a structure in which the solder resist layer 12 is formed on one side of the core substrate 11, and the wiring structure 13 as a high-density wiring structure is formed on the other side of the core substrate 11. That is, the wiring board 10 has a vertically asymmetric structure with respect to the core substrate 11. Incidentally, in the wiring board 10, the metal plate 20 high in mechanical strength is provided on the upper side (wiring structure 13 side) from the thicknesswise central position D1 of the insulating layer 21 inside the core substrate 1. Thus, the position of the metal plate 20 high in mechanical strength can be made close to the thicknesswise center of the wiring board 10. Therefore, when the wiring board 10 is viewed in the up/down direction (thickness direction), the wiring board 10 can be made to approximate a vertically symmetric structure with respect to the metal plate 20. As a result, the wiring board 10 can be formed into a structure strong against warping. Accordingly, warping can be suppressed from occurring in the wiring board 10.

Next, a method for manufacturing the wiring board 10 will be described. For description's convenience, portions which will serve as constituent elements of the wiring board 10 finally are referred to by reference signs of the final constituent element respectively in the description.

First, in a step shown in FIG. 3A, a frame 60, and a metal plate 20 which has been fixed on an upper surface 60A of the frame 60 are prepared. A large-sized substrate from which a large number of wiring boards 10 (see FIGS. 1A and 1B) can be produced is used as the metal plate 20. To describe in detail, the metal plate 20 has a block BI in which a plurality of individual regions A1 are provided, and an outer peripheral portion C1 which is formed to surround the block BI, as shown in FIG. 3B. The plurality of individual regions A1 are provided in a matrix pattern (3x3 in this case) in the block BI. Here, the individual regions A1 are regions which will be finally cut along broken lines and divided into respective wiring boards 10 individually and separately. Incidentally, the plurality of individual regions A1 may be arrayed to be separated from one another at a predetermined distance as shown in FIG. 3B, or may be arrayed to make contact with one another.

For example, the frame 60 is formed into a frame shape which is rectangular in plan view. For example, a lower surface of the outer peripheral portion C1 of the metal plate 20 is adhesively bonded (fixed) on an upper surface 60A of the frame 60. Specifically, the frame 60 fixes the metal plate 20 in a state in which the outer peripheral portion C1 of the metal plate 20 is pulled outward by predetermined tensile force, in order to prevent the block BI (respective individual regions A1) of the metal plate 20 from bending. For example, a metal material such as stainless steel (SUS) or aluminum (Al) or a resin material such as an epoxy resin can be used as the material of the frame 60.

Incidentally, steps of FIGS. 4A to 7B which will be described below are carried out in a state in which the metal plate 20 has been fixed by the frame 60 while pulled outward. Specifically, the frame 60 fixes the metal plate 20 in a state in which the outer peripheral portion C1 of the metal plate 20 is pulled outward after the metal plate 20 is fixed and before the metal plate 20 is separated. Thus, warping can be preferably suppressed from occurring in the metal plate 20 in any of the respective steps during manufacturing. Hence, warping can be preferably suppressed from occurring in a structure body (wiring board 10) during manufacturing.

Figure 4A:
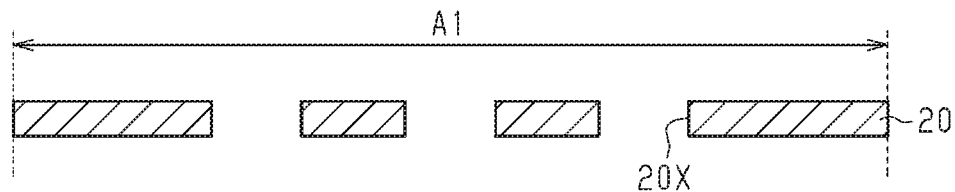
FIGS. 4A to 4D are schematic sectional views showing the method for manufacturing the wiring board according to the embodiment.

In addition, in a step shown in FIG. 3B, a plurality of through holes 20X are formed at required places in the respective individual regions A1 of the metal plate 20. As shown in FIG. 4A, the through holes 20X are formed to penetrate the metal plate 20 in the thickness direction. The through holes 20X can be formed, for example, by etching machining or press machining. Incidentally, the through holes 20X may be formed before the metal plate 20 is fixed on the frame 60 or may be formed after the metal plate 20 is fixed on the frame 60.

One individual region A1 of the large-sized metal plate 20 shown in FIG. 3B is enlarged and shown in FIG. 4A. Similarly, one individual region A1 will be also enlarged and shown in FIGS. 4B to 6D which will be described below.

Figure 4B:
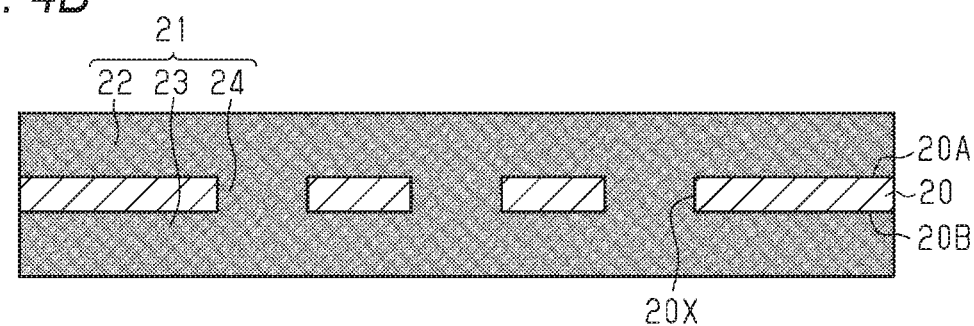

Next, in a step shown in FIG. 4B, an insulating layer 21 is formed to cover an upper surface 20A and a lower surface 20B of the metal plate 20 and fill the through holes 20X. For example, B-stage (semi-hardened) insulating layers are disposed respectively on the upper side and the lower side of the metal plate 20, and the semi-hardened insulating layers are heated and pressurized from the opposite upper and lower surfaces in a vacuum atmosphere and at a temperature of about 190° C. to 220° C. Thus, not only are the through holes 20X filled with the semi-hardened insulating layers, but also the upper surface 20A and the lower surface 20B of the metal plate 20 are covered with the semi-hardened insulating layers. When the semi-hardened insulating layers are then hardened by heat treatment, an insulating layer 22 which covers the upper surface 20A of the metal plate 20, an insulating layer 23 which covers the lower surface 20B of the metal plate 20 and an insulating layer 24 which fills the through holes 20X are formed integrally. The insulating layer 21 is constituted by these insulating layers 22 to 24. Further, the insulating layer 21 (insulating layers 22 to 24) are adhesively bonded to the metal plate 20 due to the hardening of the aforementioned insulating layers.

Incidentally, the thickness of the insulating layer 22 in the step is set, for example, to be substantially equal to the thickness of the insulating layer 23. The thickness of each of the insulating layers 22 and 23 in this case can be set, for example, in a range of about 20 to 30 μm.

Figure 4C:
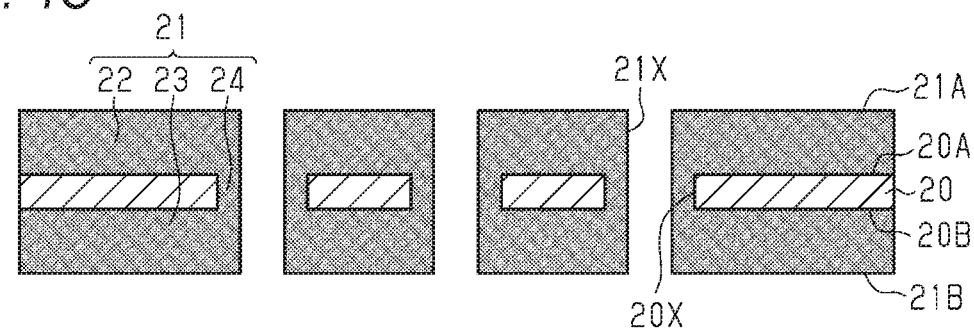

Successively, in a step shown FIG. 4C, through holes 21X are formed at required places in the insulating layer 21 to penetrate the insulating layer 21 in the thickness direction. In this step, the through holes 21X are formed so as to prevent inner wall surfaces of the through holes 20X of the metal plate 20 from being exposed from the insulating layer 21, i.e. so as to leave the insulating layer 21 (insulating layer 24) covering the inner wall surfaces of the through holes 20X. Therefore, an opening diameter of each of the through holes 21X is set to be smaller than an opening diameter of a corresponding one of the through holes 20X.

Figure 4D:
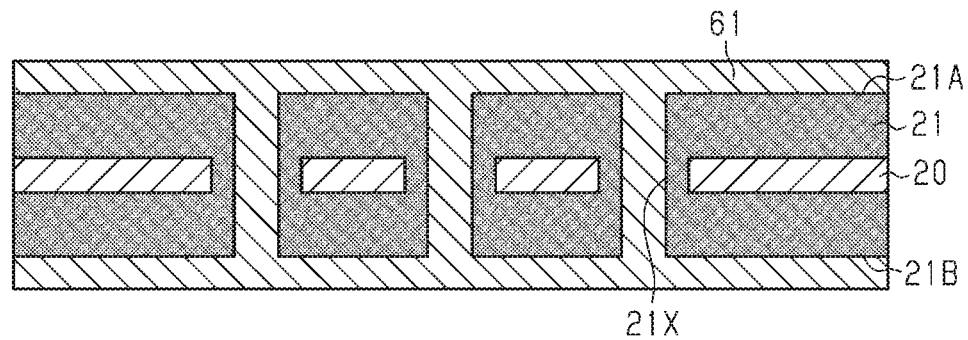

Next, in a step shown in FIG. 4D, a seed layer (not shown) is formed to cover the entire surface of the insulating layer 21 including inner wall surfaces of the through holes 21X, and electrolytic plating (panel plating in this case) using the seed layer as a power feeding layer is carried out. For example, the seed layer is formed by electroless copper plating to cover the entire surface of the insulating layer 21, and electrolytic copper plating using the seed layer as a power feeding layer is carried out. Thus, an electrically conductive layer 61 is formed to fill the through holes 21X and cover an entire upper surface 21A and an entire lower surface 21B of the insulating layer 21.

Figure 5A:
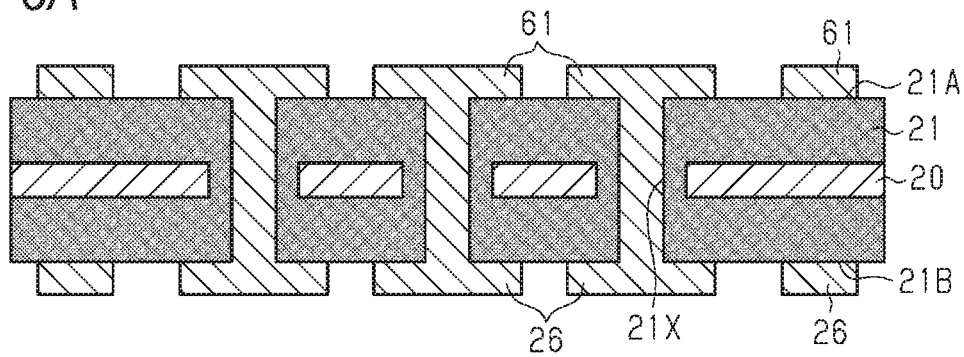
FIGS. 5A to 5D are schematic sectional views showing the method for manufacturing the wiring board according to the embodiment.

Next, in a step shown in FIG. 5A, the electrically conductive layer 61 formed on the entire lower surface 21B of the insulating layer 21 is patterned so that a wiring layer 26 can be formed on the lower surface 21B of the insulating layer 21. The wiring layer 26 can be formed, for example, by a subtractive method. In addition, in this example, the electrically conductive layer 61 formed on the entire upper surface 21A of the insulating layer 21 is patterned so that parts of the electrically conductive layer 61 formed on the upper surface 21A of the insulating layer 21 can be removed simultaneously when the wiring layer 26 is formed. The patterning is performed, for example, in order to reduce the volume of the electrically conductive layer 61 which will be removed by polishing in a subsequent step, i.e. the electrically conductive layer 61 formed on the upper surface 21A of the insulating layer 21. Incidentally, the patterning is performed so as not to remove the electrically conductive layer 61 in portions overlapping with the through holes 21X in plan view.

Figure 5B:
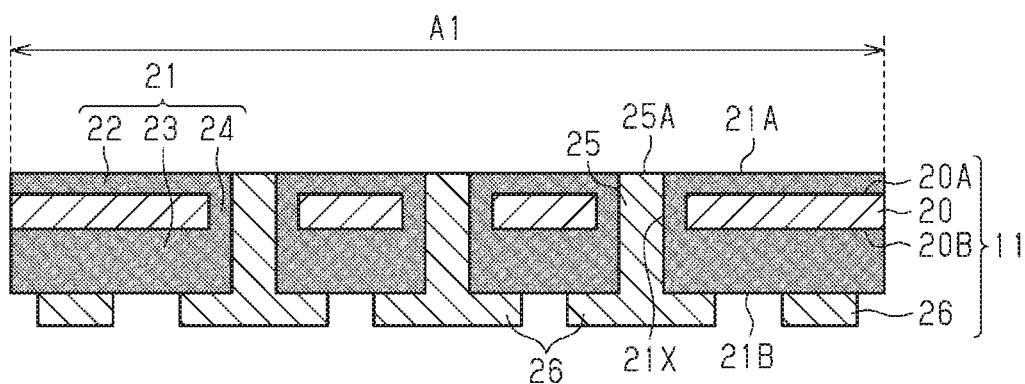

Successively, for example, by a CMP (Chemical Mechanical Polishing) method etc., the electrically conductive layer 61 protruding from the upper surface 21A of the insulating layer 21 is polished and a portion of the upper surface 21A of the insulating layer 21 is polished. Thus, through electrodes 25 filled in the through holes 21X are formed and upper end surfaces 25A of the through electrodes 25 are formed to be substantially flush with the upper surface 21A of the insulating layer 21, as shown in FIG. 5B. In addition, when the portion of the upper surface 21A of the insulating layer 21 is polished, the upper surface 21A of the insulating layer 21 is smoothened. For example, roughness of the upper surface 21A of the insulating layer 21 which has not been polished is about 300 to 400 nm in terms of surface roughness Ra value, whereas the roughness of the upper surface 21A of the insulating layer 21 can be changed to about 15 to 40 nm in terms of surface roughness Ra value due to polishing. In other words, in this step, the upper surface 21A of the insulating layer 21 is polished so that the upper surface 21A of the insulating layer 21 can be smoothened (e.g. to be about 15 to 40 nm in terms of surface roughness Ra value). Incidentally, the roughness of the lower surface 21B of the insulating layer 21 is substantially equal to the roughness of the upper surface 21A of the insulating layer 21 which has not been polished. Therefore, the upper surface 21A of the insulating layer 21 which has been polished is smaller in surface roughness than the lower surface 21B of the insulating layer 21. By the polishing in this step, the upper surface 21A of the insulating layer 21 and the upper end surfaces 25A of the through electrodes 25 are changed to polished surfaces.

Further, when the portion of the upper surface 21A of the insulating layer 21 (insulating layer 22) is polished as described above, the insulating layer 22 becomes thinner in thickness than the insulating layer 23. Specifically, when the portion of the upper surface 21A of the insulating layer 21 is polished, out of the insulating layer 21, the insulating layer 22 covering the upper surface 20A of the metal plate 20 is thinned. Therefore, the insulating layer 22 becomes thinner in thickness than the insulating layer 23 covering the lower surface 20B of the metal plate 20. Thus, the metal plate 20 which was provided in the vicinity of the thicknesswise center of the insulating layer 21 prior to the polishing can be provided on the upper side from the thicknesswise center of the insulating layer 21. Incidentally, in this step, the insulating layer 21 is polished so that the metal plate 20 can be prevented from being exposed from the insulating layer 21 (insulating layer 22).

Here, a reduction amount of the insulating layer 21 by polishing in this step can be set, for example, in a range of about 5 to 15 μm. Therefore, the thickness of the insulating layer 22 which has been polished reaches about 10 to 15 μm and thickness of the insulating layer 23 reaches about 20 to 30 pun.

Incidentally, when, for example, the electrically conductive layer 61 (See FIG. 5A) formed on the upper surface 21A of the insulating layer 21 is polished by the CMP method in this example, the quality of a slurry material, hardness of a polishing pad, etc. can be adjusted to make a polishing amount of the electrically conductive layer 61 (metal) larger than a polishing amount of the insulating layer 21 (resin). On this occasion, the electrically conductive layer 61 formed on the upper surface 21A of the insulating layer 21 has been patterned (to thereby reduce the volume of the electrically conductive layer 61) in the step shown in FIG. 5A so that a polishing time in this step can be shortened, in comparison with a case where the electrically conductive layer 61 is formed on the entire upper surface 21A of the insulating layer 21. In addition, in the CMP method in this example, the quality of the slurry material, the hardness of the polishing pad, etc. can be changed, for example, after the entire upper surface 21A of the insulating layer 21 is exposed. Specifically, after the entire upper surface 21A of the insulating layer 21 is exposed, the quality of the slurry material, the hardness of the polishing pad, etc. can be adjusted to make the polishing amount of the insulating layer 21 (resin) larger than the polishing amount of the electrically conductive layer 61 (metal).

By the aforementioned manufacturing steps, a structure body corresponding to the core substrate 11 in each of the individual regions A1 is manufactured.

Figure 5C:
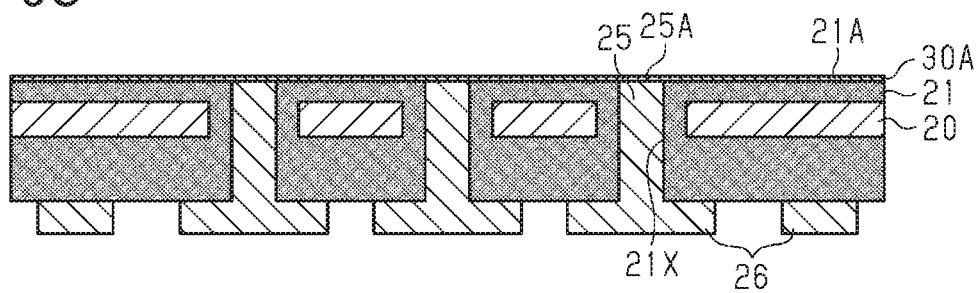

Next, in a step shown in FIG. 5C, a seed layer 30A is formed to cover the entire upper surface 21A of the insulating layer 21 and the entire upper end surfaces 25A of the through electrodes 25. The seed layer 30A can be formed, for example, by sputtering or electroless plating. For example, due to the upper surface 21A of the insulating layer 21 which is a smooth surface, the seed layer 30A can be formed uniformly on the upper surface 21A by sputtering in this step. Thus, an upper surface of the seed layer 30A can be formed smoothly.

For example, assume that the seed layer 30A is formed by sputtering. In this case, first, titanium is deposited on the upper surface 21A of the insulating layer 21 and the upper end surfaces 25A of the through electrodes 25 by sputtering to form a Ti layer so that the upper surface 21A and the upper end surfaces 25A can be covered with the Ti layer. Then, copper is deposited on the Ti layer by sputtering to form a Cu layer. Thus, the seed layer 30A having a two-layer structure (Ti layer/Cu layer) can be formed. In addition, assume that the seed layer 30A is formed by electroless copper plating. In this case, for example, the seed layer 30A consisting of a Cu layer (one-layer structure) can be formed by electroless copper plating.

Figure 5D:
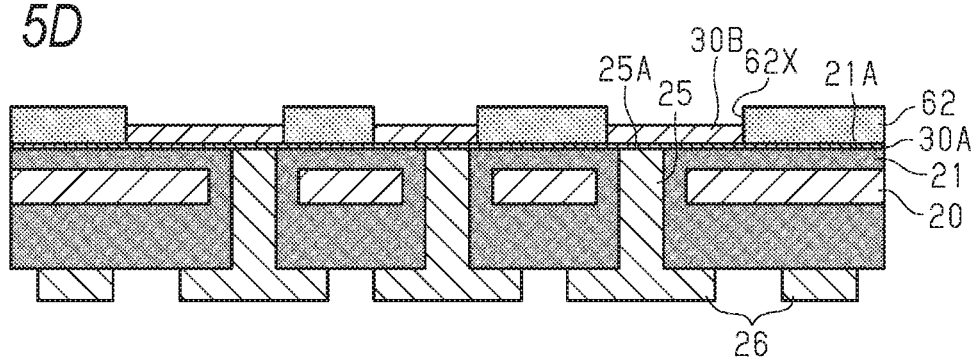

Next, in a step shown in FIG. 5D, a resist layer 62 having opening patterns 62X at predetermined places are formed on the seed layer 30A. The opening patterns 62X are formed to expose the seed layer 30A in portions corresponding to regions where a wiring layer 30 (see FIG. 1A) should be formed. As the material of the resist layer 62, for example, a plating-resistant material to plating treatment in a next step can be used. For example, a photosensitive dry film resist or a liquid photoresist (e.g. a dry film resist or a liquid photoresist of a novolac-based resin or an acrylic-based resin etc.) etc. can be used as the material of the resist layer 62. For example, assume that the photosensitive dry film resist is used. In this case, a dry film is laminated on the upper surface of the seed layer 30A by thermocompression bonding, and the dry film is then patterned by photolithographing. In this manner, the resist layer 62 having the opening patterns 62X is formed. Incidentally, when the liquid photoresist is used alternatively, the resist layer 62 can be also formed by a similar step. Due to the upper surface of the seed layer 30A which is a smooth surface, a patterning defect can be suppressed from being generated in the resist layer 62 formed on the seed layer 30A in this step. That is, the opening patterns 62X can be formed with high accuracy.

Next, electrolytic plating using the seed layer 30A as a plating power feeding layer is performed on the upper surface of the seed layer 30A with the resist layer 62 as a plating mask. Specifically, electrolytic plating (electrolytic copper plating in this case) is performed on the upper surface of the seed layer 30A exposed from the opening patterns 62X of the resist layer 62. In this manner, a metal layer 30B (electrolytic plating metal layer) is formed on the upper surface of the seed layer 30A.

Figure 6A:
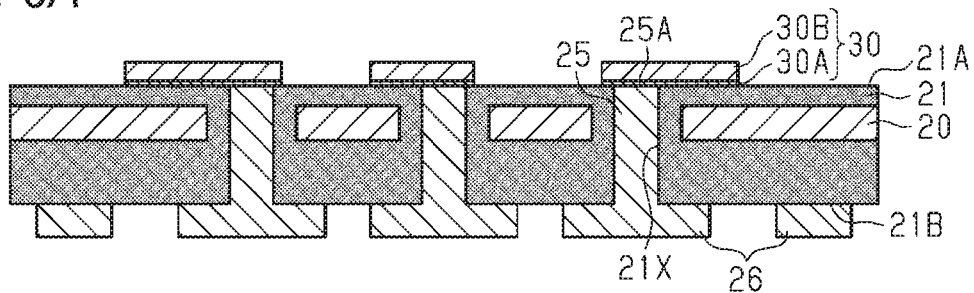
FIGS. 6A to 6D are schematic sectional views showing the method for manufacturing the wiring board according to the embodiment.

Successively, the resist layer 62 is removed, for example, by an alkaline release agent. Next, an unnecessary part of the seed layer 30A is removed by etching with the metal layer 30B as an etching mask. Thus, the wiring layer 30 including the seed layer 30A which is brought into contact with the upper end surfaces 25A of the through electrodes 25 and the metal layer 30B which is formed on the seed layer 30A is formed on the upper surface 21A of the insulating layer 21, as shown in FIG. 6A. In this manner, the wiring layer 30 is formed by a semi-additive method. In addition, since the wiring layer 30 and the through electrodes 25 are formed by individual steps, the wiring layer 30 and the through electrodes 25 are not formed integrally.

Figure 6B:
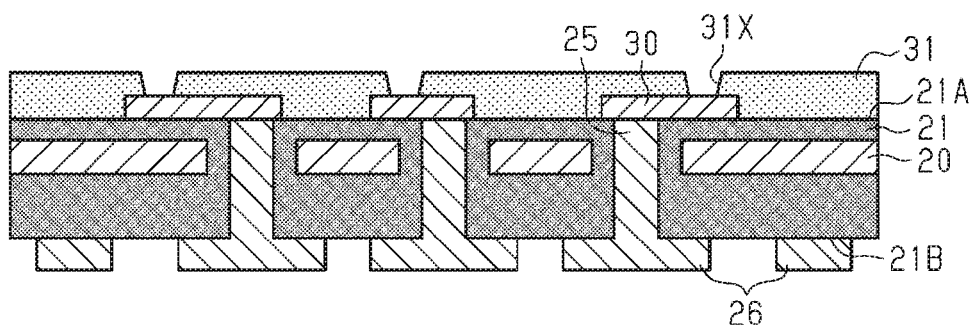

Next, in a step shown in FIG. 6B, an insulating layer 31 which has through holes 31X for exposing parts of an upper surface of the wiring layer 30 is formed on the upper surface 21A of the insulating layer 21. For example, assume that a resin film is used as the insulating layer 31. In this case, the resin film is laminated on the upper surface 21A of the insulating layer 21 by thermocompression bonding, and the resin film is then patterned by photolithographing. Thus, the insulating layer 31 is formed. Alternatively, the insulating layer 31 may be formed in such a manner that a liquid or paste-like insulating resin is applied to the upper surface 21A of the insulating layer 21 by spin coating etc., and the insulating resin is then patterned by photolithographing.

Figure 6C:
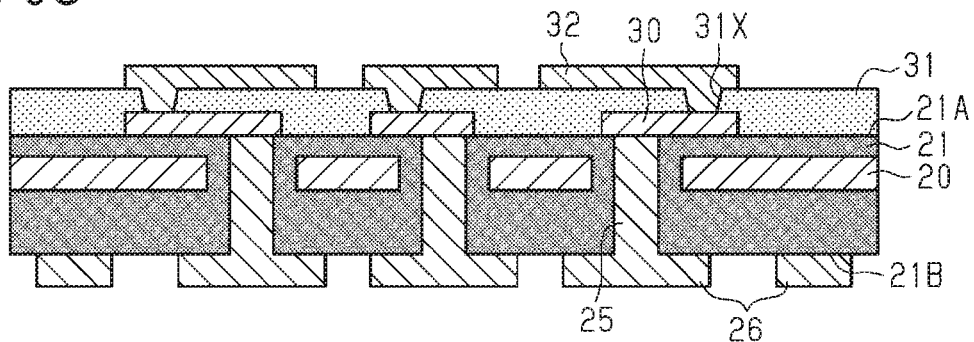

Next, in a step shown in FIG. 6C, a wiring layer 32 having via wirings which are filled in the through holes 31X and wiring patterns which are formed on the upper surface of the insulating layer 31 to be electrically connected to the wiring layer 30 through the via wirings is formed, for example, by a semi-additive method, similarly to that in the steps shown in FIGS. 5C to 6A.

Figure 6D:
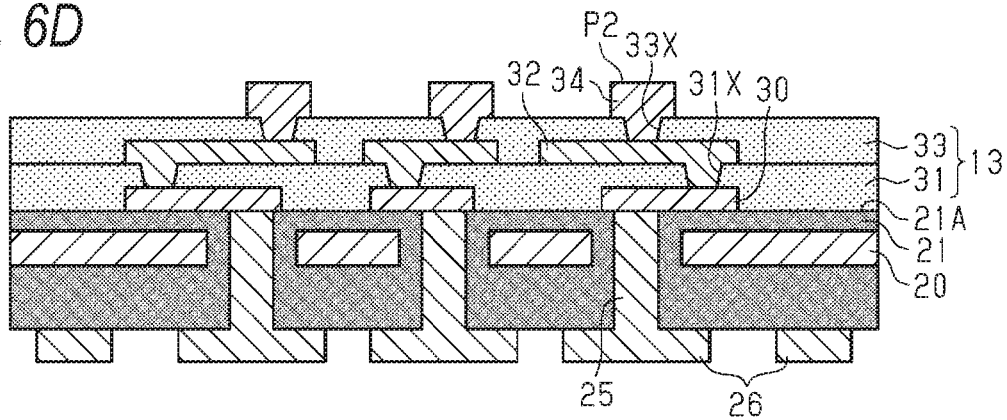

Next, in a step shown in FIG. 6D, an insulating layer 33 which has through holes 33X for exposing parts of an upper surface of the wiring layer 32 is formed on the insulating layer 31 similarly to that in the step shown in FIG. 6B. Successively, a wiring layer 34 having via wirings which are filled in the through holes 33X and pads P2 which are formed on an upper surface of the insulating layer 33 to be electrically connected to the wiring layer 32 through the via wirings is formed, for example, by a semi-additive method, similarly to that in the steps shown in FIGS. 5C to 6A. Incidentally, if occasions demand, a surface treatment layer may be formed on front surfaces of the pads P2.

By the aforementioned manufacturing steps, a wiring structure 13 is formed on the upper surface 21A of the insulating layer 21.

Figure 7A:
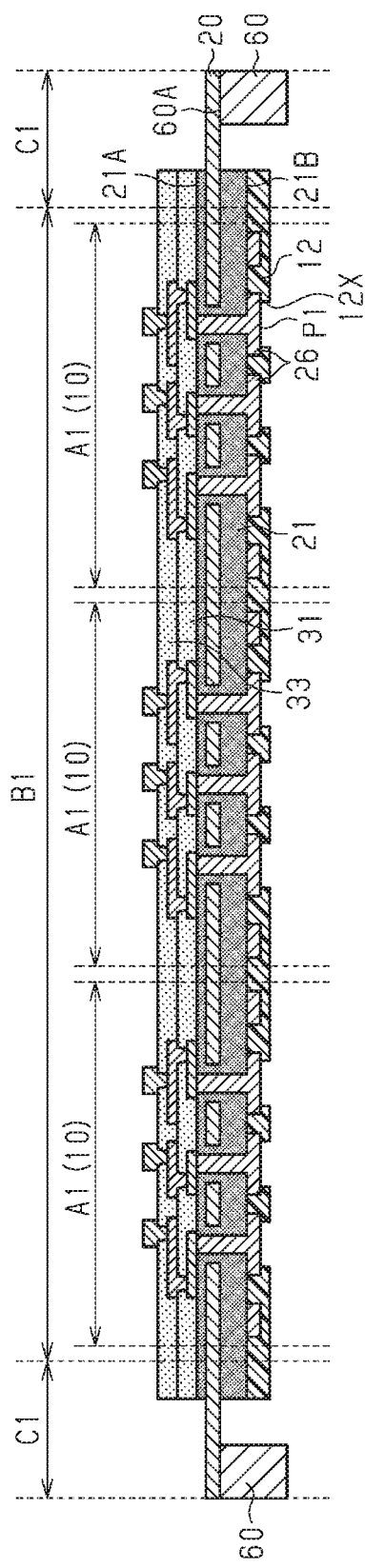
FIGS. 7A and 7B are schematic sectional views showing the method for manufacturing the wiring board according to the embodiment.

Next, in a step shown in FIG. 7A, a solder resist layer 12 having opening portions 12X for exposing parts of a lower surface of the lowermost wiring layer 26 is formed on the lower surface 21B of the insulating layer 21. The solder resist layer 12 can be formed, for example, in such a manner that a photosensitive solder resist film is laminated or a liquid solder resist is applied and the resist is then patterned into a required shape. Thus, parts of the lower surface of the wiring layer 26 are exposed as external connection pads P1 from the opening portions 12X of the solder resist layer 12. Incidentally, if occasions demand, a surface treatment layer may be formed on the external connection pads P.

By the aforementioned manufacturing steps, a structure body corresponding to the wiring board 10 in each of the individual regions A1 can be manufactured. Incidentally, the solder resist layer 12 and the insulating layers 21, 31 and 33 are formed to extend out to a portion of the outer peripheral portion C1 of the metal plate 20, as shown in FIG. 7A.

Figure 7B:
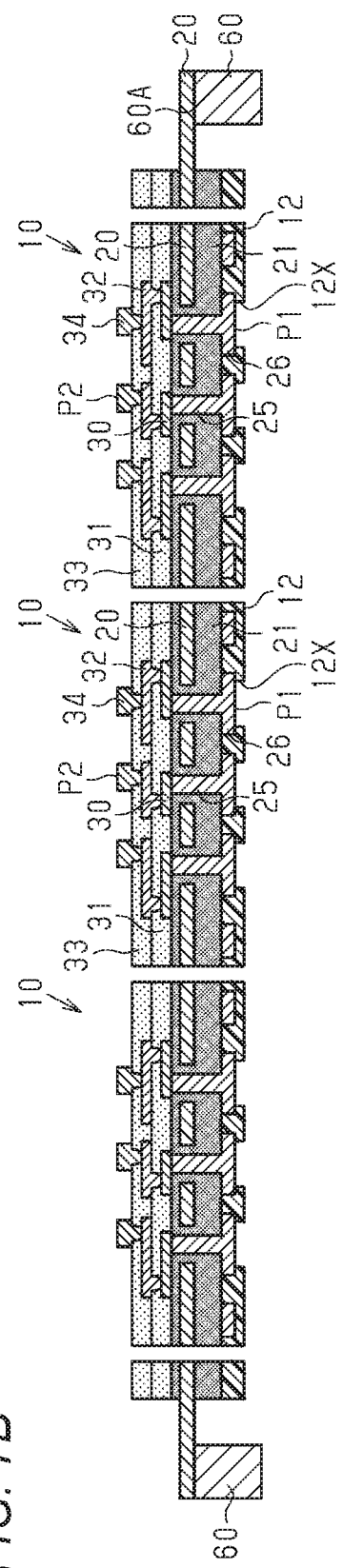

Next, the solder resist layer 12, the metal plate 20, the insulating layers 21, 31 and 33 and the wiring layer 26 in cutting positions indicated by broken lines in FIG. 7A are cut by a dicing saw etc., i.e. the structure body shown in FIG. 7A is cut in accordance with the respective individual regions A1 and divided into wiring boards 10 individually. On this occasion, a side surface of the solder resist layer 12, a side surface of the insulating layer 21, a side surface of the metal plate 20, and side surfaces of the insulating layers 31 and 33, which are cutting surfaces, are formed to be substantially flush with one another, as shown in FIG. 7B. In addition, the metal plates 20 of the wiring boards 10 divided individually are separated from the frame 60 by this step.

By the aforementioned manufacturing steps, the wiring board 10 shown in FIGS. 1A and 1B can be manufactured.

According to the aforementioned embodiment, it is possible to obtain the following effects.

(1) The metal plate 20 high in mechanical strength (rigidity) is provided as the core material of the core substrate 11. Accordingly, the rigidity of the core substrate 11 can be enhanced. For example, even in the case where, the core substrate 11 has been made thin, the rigidity of the core substrate 11 can be secured by the metal plate 20. Hence, the rigidity of the wiring board 10 can be secured. Therefore, warping can be suppressed from occurring in the wiring board 10 while the wiring board 10 as a whole is thinned.

(2) The metal plate 20 is provided on the upper side from the thicknesswise central position D1 of the insulating layer 21. Thus, the position of the metal plate 20 high in mechanical strength can be made close to the thicknesswise center of the wiring board 10. Therefore, the structure of the wiring board 10 when it is seen in the up/down direction can be made to approximate a vertically symmetric structure with respect to the metal plate 20. As a result, the wiring board 10 can be formed into a structure strong against warping. Accordingly, warping can be preferably suppressed from occurring in the wiring board 10.

(3) Further, the thickness of the insulating layer 21 (insulating layer 22) formed on the upper surface 20A of the metal plate 20 and the thickness of the insulating layer 21 (insulating layer 23) formed on the lower surface 20B of the metal plate 20 are set so that the metal plate 20 can be disposed in the thicknesswise center of the wiring board 10 as a whole. Thus, the structure of the wiring board 10 when it is seen in the up/down direction can be made to more greatly approximate a vertically symmetric structure with respect to the metal plate 20. As a result, warping can be more preferably suppressed from occurring in the wiring board 10.

(4) A so-called glass epoxy substrate which is formed by impregnating a reinforcing material such as glass cloths with a thermosetting insulating resin and then hardening the thermosetting insulating resin is often used as a background-art core substrate. Each of surfaces of a large number of the glass cloths is covered with a thin resin layer in the glass epoxy substrate. When an upper surface of such a core substrate is polished by the CMP method etc. in order to reduce the thickness of the core substrate, the glass cloths inside the core substrate are exposed in the upper surface of the core substrate easily. When the glass cloths are exposed, flattening of the upper surface of the core substrate becomes difficult. Therefore, it is necessary to form a resin layer on the upper surface of the core substrate in order to form a similar micro wiring structure to the wiring structure 13 on the upper surface side of the core substrate. In this case, the wiring board is hindered from being thinned due to the resin layer provided for flattening.

On the other hand, in the wiring board 10, one thin metal plate 20 is internally provided as the core material in the insulating layer 21. Accordingly, the metal plate 20 can be preferably suppressed from being exposed in the upper surface 21A of the insulating layer 21 when the upper surface 21A is polished. In this manner, the upper surface 21A of the insulating layer 21 can be easily flattened by polishing. Accordingly, the wiring structure 13 can be formed directly on the upper surface 21A of the insulating layer 21. Thus, the wiring board 10 as a whole can be thinned.

(5) The frame 60 fixes metal plate 20 in a state in which the outer peripheral portion C1 of the metal plate 20 is pulled outward after the metal plate 20 is fixed and before the metal plate 20 is separated. Thus, warping can be preferably suppressed from occurring in the metal plate 20 in the respective steps during manufacturing. Hence, warping can be preferably suppressed from occurring in the structure body (wiring board 10) during manufacturing.

Other Embodiments

Incidentally, the aforementioned embodiment may be suitably changed and carried out in the following modes.

According to the aforementioned embodiment, the electrically conductive layer 61 formed on the upper surface 21A of the insulating layer 21 is patterned, and the parts of the electrically conductive layer 61 formed on the upper surface 21A of the insulating layer 21 are removed in the step shown in FIG. 5A. The present disclosure is however not limited thereto. The step of patterning the electrically conductive layer 61 formed on the upper surface 21A of the insulating layer 21 may be dispensed with. In this case, the electrically conductive layer 61 covering the entire upper surface 21A of the insulating layer 21 can be removed by polishing, for example, in the step shown in FIG. 5B.

In the method for manufacturing the wiring board 10 according to the aforementioned embodiment, the solder resist layer 12 may be formed at any timing if the timing is after the lowermost wiring layer 26 is formed. For example, the solder resist layer 12 may be formed immediately after the step (see FIG. 5B) of polishing the upper surface 21A of the insulating layer 21.

A solder resist layer may be formed on the upper surface of the insulating layer 33 according to the aforementioned embodiment.

Although the aforementioned embodiment is materialized in the manufacturing method for producing multiple pieces, it may be materialized in a manufacturing method for producing a single piece (producing one piece).

According to the aforementioned embodiment, the thicknesses of the insulating layers 22 and 23 are set so that the metal plate 20 can be disposed in the vicinity of the thicknesswise center of the wiring board 10 as a whole. The present disclosure is however not limited thereto. For example, the insulating layer 22 may be merely set to be thinner in thickness than the insulating layer 23. Even in such a structure, it is possible to obtain similar effects to the effects (1), (2) and (4) of the aforementioned embodiment.

According to the aforementioned embodiment, the upper end surfaces 25A of the through electrodes 25 are formed to be flush with the upper surface 21A of the insulating layer 21. The present disclosure is however not limited thereto. For example, the upper end surfaces 25A of the through electrodes 25 may be formed to be recessed more downward than the upper surface 21A of the insulating layer 21. In addition, the upper end surfaces 25A of the through electrodes 25 may be formed alternatively to protrude more upward than the upper surface 21A of the insulating layer 21.

According to the aforementioned embodiment, the semiconductor chip 50 is mounted on the wiring board 10. The present disclosure is however not limited thereto. For example, an electronic component such as a chip component such as a chip capacitor, a chip resistor or a chip inductor, or a crystal oscillator may be used in place of the semiconductor chip 50 and mounted on the wiring board 10.

In addition, a mounting form (e.g. flip-chip mounting, wire bonding mounting, solder mounting or a combination of the aforementioned mountings) etc. of the semiconductor chip 50 or the electronic component such as the chip component or the crystal oscillator can be modified or changed variously.

The number of layers for the wiring layer 26, the through electrodes 25 and the insulating layer 21, wiring routing etc. in the core substrate 11 according to the aforementioned embodiment can be modified or changed variously. For example, a plurality of wiring layers and a plurality of insulating layers may be provided on the lower surface 21B of the insulating layer 21.

The number of layers for the wiring layers 30, 32 and 34 and the insulating layers 31 and 33, wiring routing, etc.

in the wiring structure 13 according to the aforementioned embodiment can be modified or changed variously.

The sectional shape of each through hole formed in the wiring board 10 according to the aforementioned embodiment is not limited particularly. For example, the through hole formed in the wiring board 10 may be formed into a straight shape (substantially rectangular shape in sectional view).

The aforementioned embodiment and the respective modifications may be combined suitably.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

1) A method of manufacturing a wiring board, the method comprising:

a) preparing a metal plate having a plurality of first through holes:

b) forming a first insulating layer to cover an upper surface and a lower surface of the metal plate and fill the first through holes:

c) forming a plurality of second through holes through the first insulating layer, wherein each of the second through holes is overlapped with a corresponding one of the first through holes in plan view, and, in plan view, an opening area of each of the second through holes is smaller than that of each of the first through holes;

d) forming an electrically conductive layer to fill the second through holes and cover an upper surface and a lower surface of the first insulating layer;

e) patterning the electrically conductive layer formed on the lower surface of the first insulating layer to form a first wiring layer on the lower surface of the first insulating layer;

f) polishing the electrically conductive layer formed on the upper surface of the first insulating layer and a portion of the upper surface of the first insulating layer to form a plurality of through electrodes each filled in one of the second through holes, wherein each of the through electrodes is formed integrally with the first wiring layer and has an upper end surface exposed in the upper surface of the first insulating layer; and g) forming a wiring structure on the upper surface of the first insulating layer, wherein the wiring structure comprises insulating layers and wiring layers, and each of the insulating layers is made of an insulating resin containing a photosensitive resin as a main component, wherein a wiring density of the wiring structure is higher than that of the first wiring layer; and wherein the step (f) comprises polishing the upper surface of the first insulating layer such that the metal plate is located at a side of the wiring structure with respect to a center of the first insulating layer in a thickness direction thereof.

2) The method of clause (1), further comprising:

h) fixing the metal plate onto a frame before the step (b): and i) separating the metal plate from the frame after the step (g), wherein the metal plate is fixed by the frame such that an outer peripheral portion of the metal plate is pulled outward after the metal plate is fixed onto the frame and before the metal plate is separated from the frame.

3) The method of clause (1), wherein the step (e) comprises removing a portion of the electrically conductive layer formed on the upper surface of the first insulating layer.

What is claimed is:

1. A wiring board comprising:

a core substrate comprising:

a metal plate having a plurality of first through holes;

a first insulating layer covering an upper surface and a lower surface of the metal plate and inner wall surfaces of the first through holes;

a plurality of through electrodes each disposed in a corresponding one of the first through holes to penetrate the first insulating layer in a thickness direction of the first insulating layer and each having an upper end surface exposed from the first insulating layer;

a first wiring layer formed on a lower surface of the first insulating layer and connected to the through electrodes;

a wiring structure formed on an upper surface of the first insulating layer and comprising insulating layers each made of an insulating resin containing a photosensitive resin as a main component, and wiring layers; and an outermost insulating layer formed on a lower surface of the core substrate, wherein a wiring density of the wiring structure is higher than that of the core substrate, and the metal plate is located at a side of the wiring structure with respect to a center of the first insulating layer in a thickness direction thereof.

2. The wiring board of claim 1, wherein the wiring structure comprises:

a second wiring layer formed on the upper surface of the first insulating layer to contact the upper end surfaces of the through electrodes; and a second insulating layer formed on the upper surface of the first insulating layer to cover at least a portion of the second wiring layer, and wherein an uppermost wiring layer of the wiring structure functions as a pad configured to be connected to an electronic component.

3. The wiring board of claim 1, wherein the first insulating layer has a plurality of second through holes, and each of the second through holes is overlapped with a corresponding one of the first through holes in plan view, and in plan view, an opening area of each of the second through holes is smaller than that of each of the first through holes, each of the through electrodes is formed in a corresponding one of the second through holes, and the first wiring layer is formed integrally with the through electrodes.

4. The wiring board of claim 1, wherein the metal plate is made of a material that is lower in coefficient of thermal expansion than the first insulating layer and higher in elastic modulus than the first insulating layer.

5. A semiconductor device comprising:
a wiring board of claim 1; and
a semiconductor chip which is flip-chip mounted on the uppermost wiring layer of the wiring structure.

* * * * *